(12) United States Patent
Feilchenfeld et al.

(10) Patent No.: US 9,059,276 B2
(45) Date of Patent: Jun. 16, 2015

(54) HIGH VOLTAGE LATERALLY DIFFUSED METAL OXIDE SEMICONDUCTOR

(71) Applicant: INTERNATIONAL BUSINESS MACHINES CORPORATION, Armonk, NY (US)

(72) Inventors: Natalie B. Feilchenfeld, Jericho, VT (US); Theodore J. Letavic, Colchester, VT (US); Richard A. Phelps, Colchester, VT (US); Santosh Sharma, Essex Junction, VT (US); Yun Shi, South Burlington, VT (US); Michael J. Zierak, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 13/912,781

(22) Filed: Jun. 7, 2013

(65) Prior Publication Data

US 2014/0346597 A1 Nov. 27, 2014

Related U.S. Application Data

(60) Provisional application No. 61/827,287, filed on May 24, 2013.

(51) Int. Cl.
*H01L 21/76* (2006.01)
*H01L 21/335* (2006.01)
(Continued)

(52) U.S. Cl.
CPC ...... *H01L 29/7816* (2013.01); *H01L 29/66681* (2013.01)

(58) Field of Classification Search
CPC ............ H01L 29/7816; H01L 29/1045; H01L 21/823807; H01L 27/0922; H01L 29/66681; H01L 29/0878; H01L 21/743; H01L 21/823814; H01L 29/6625; H01L 29/735; H01L 29/1095

USPC ......... 257/339, 190, 347, 357, 353, 401, 532, 257/77, 129, 448, 350, 355, 168, 173, 177, 257/659, 409, 109, 408, 549, 343, 492, 493, 257/335, E29.246, E21.427, E21.433; 438/135, 197, 282, 286, 298, 301, 455, 438/181, 525, 545, 142, 299, 400
See application file for complete search history.

(56) References Cited

U.S. PATENT DOCUMENTS 4,574,208 A * 3/1986 Lade et al. ..................... 327/389
5,204,545 A * 4/1993 Terashima .................... 257/490
(Continued)

OTHER PUBLICATIONS

Anonymous, "Method is Disclosed for Fabricating Laterally Diffused Metal Oxide Semiconductor (LDMOS) Device with Oxide Protection Layer Over Drift Region." Sep. 9, 2010, IP.com PriorArtDatabase, pp. 1-5.*
(Continued)

*Primary Examiner* — Evan Pert
*Assistant Examiner* — Gustavo Ramallo
(74) *Attorney, Agent, or Firm* — Michael J. LeStrange; Roberts Mlotkowski Safran & Cole, P.C.

(57) ABSTRACT

High-voltage LDMOS devices with voltage linearizing field plates and methods of manufacture are disclosed. The method includes forming an insulator layer of varying depth over a drift region and a body of a substrate. The method further includes forming a control gate and a split gate region by patterning a layer of material on the insulator layer. The split gate region is formed on a first portion of the insulator layer and the control gate is formed on a second portion of the insulator layer, which is thinner than the first portion.

19 Claims, 6 Drawing Sheets

(51) Int. Cl.
  *H01L 21/8232* (2006.01)
  *H01L 21/336* (2006.01)
  *H01L 29/66* (2006.01)
  *H01L 29/78* (2006.01)

(56) References Cited

U.S. PATENT DOCUMENTS

| | | | | |
|---|---|---|---|---|
| 5,444,002 | A * | 8/1995 | Yang | 438/286 |
| 5,648,288 | A * | 7/1997 | Williams et al. | 438/202 |
| 5,907,173 | A * | 5/1999 | Kwon et al. | 257/336 |
| 6,307,232 | B1 * | 10/2001 | Akiyama et al. | 257/347 |
| 6,310,378 | B1 * | 10/2001 | Letavic et al. | 257/347 |
| 6,710,396 | B1 * | 3/2004 | Wu | 257/315 |
| 6,825,531 | B1 * | 11/2004 | Mallikarjunaswamy | 257/343 |
| 6,864,537 | B1 * | 3/2005 | Mallikarjunaswamy | 257/355 |
| 6,879,005 | B2 * | 4/2005 | Yamaguchi et al. | 257/367 |
| 7,391,080 | B2 * | 6/2008 | Arnborg et al. | 257/335 |
| 7,393,752 | B2 * | 7/2008 | Yang et al. | 438/302 |
| 7,525,178 | B2 * | 4/2009 | Kulinsky | 257/630 |
| 7,535,057 | B2 * | 5/2009 | Yang | 257/335 |
| 7,582,533 | B2 * | 9/2009 | Ko | 438/286 |
| 7,608,513 | B2 * | 10/2009 | Yang et al. | 438/286 |
| 7,683,427 | B2 * | 3/2010 | Chen et al. | 257/343 |
| 7,750,401 | B2 * | 7/2010 | Cai | 257/335 |
| 7,776,700 | B2 * | 8/2010 | Yang et al. | 438/286 |
| 7,824,968 | B2 * | 11/2010 | Chu et al. | 438/135 |
| 7,910,991 | B2 | 3/2011 | Yang et al. | |
| 7,956,412 | B2 * | 6/2011 | Feilchenfeld et al. | 257/343 |
| 8,159,036 | B2 * | 4/2012 | Matsudai et al. | 257/408 |
| 8,264,038 | B2 * | 9/2012 | Pendharkar et al. | 257/337 |
| 2003/0094657 | A1 * | 5/2003 | Ehwald et al. | 257/355 |
| 2003/0173624 | A1 | 9/2003 | Choi et al. | |
| 2004/0251499 | A1 | 12/2004 | Yamaguchi et al. | |
| 2008/0246086 | A1 | 10/2008 | Korec et al. | |
| 2009/0233410 | A1 * | 9/2009 | Yu et al. | 438/291 |
| 2010/0052057 | A1 * | 3/2010 | Chung et al. | 257/362 |
| 2011/0115017 | A1 * | 5/2011 | Alter et al. | 257/341 |
| 2011/0260247 | A1 * | 10/2011 | Yang et al. | 257/343 |
| 2012/0161230 | A1 | 6/2012 | Satoh et al. | |
| 2012/0267715 | A1 * | 10/2012 | Chou et al. | 257/336 |
| 2013/0020632 | A1 * | 1/2013 | Disney | 257/328 |

OTHER PUBLICATIONS

"Floating Islands and Thick Bottom Oxide Trench Gate Mosfet (FITMOS) with Passive Hole Gate -60V Ultra Low On-Resistance Novel MOSFET-" Takaya, H.; Miyagi, K.; Hamada, K. Electron Devices Meeting, 2006. IEDM '06. International Publication Year: 2006, pp. 1-4.

IPCOM000199574D: "Method is Disclosed for Fabricating Laterally Diffused Metal Oxide Semiconductor (LDMOS) Device with Oxide Protection Layer Over Drift Region" Disclosed Anonymously Sep. 9, 2010, 6 pages.

* cited by examiner

HIGH VOLTAGE LATERALLY DIFFUSED METAL OXIDE SEMICONDUCTOR

FIELD OF THE INVENTION

The invention relates to integrated circuits and, more particularly, to high-voltage LDMOS devices and methods of manufacture.

BACKGROUND

High voltage laterally diffused metal oxide semiconductor (LDMOS) transistors are used in microwave and RF power amplifiers, for example. LDMOS devices use Metal-Insulator-Silicon (MIS) surfaces and back-channel field plates to assist in depletion of the drift region, allowing more charge to be placed into the drift region, and thereby reducing on-resistance and on-state power dissipation.

Planar LDMOS devices (devices without STI) can result in superior reliability performance due to the absence of field and current crowding at STI corners; however, in known conventionally fabricated planar LDMOS devices, gate-to-drain capacitance is high, compared to an STI based device. Field plates can also be utilized in non-planar and planar devices; however, they tend to increase gate-to-drain overlap capacitances resulting in higher switching losses which increase with switching frequency. Also, there is a fundamental tradeoff between low conduction losses (on-resistance or Rsp) and switching losses (Qgg and Qgd) and off-state breakdown voltage.

Accordingly, there exists a need in the art to overcome the deficiencies and limitations described hereinabove.

SUMMARY

In an aspect of the invention, a method comprises forming an insulator layer of varying depth over a drift region and a body of a substrate. The method further comprises forming a control gate and a split gate region by patterning a layer of material on the insulator layer. The split gate region is formed on a first portion of the insulator layer and the control gate is formed on a second portion of the insulator layer, which is thinner than the first portion.

In an aspect of the invention, a method comprises forming an insulator layer over a well implant region and a drift region formed within confines of a deep well implant region. The method further comprises forming a plate on the insulator layer. The method further comprises patterning the plate to form field plates comprising a split gate region, a control gate and a floating region. The method further comprises forming a metal wiring in electrical contact with the split gate region and a source region implanted into the well implant region.

In an additional aspect of the invention, a device comprises an insulator layer of varying depth over a drift region and a body of a substrate. The device further comprises a control gate and a split gate region on the insulator layer, wherein the split gate region is on a first portion of the insulator layer and the control gate is on a second portion of the insulator layer, which is thinner than the first portion.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the structures of the present invention. In still further embodiments, a method in a computer-aided design system is provided for generating a functional design model of the structures of the present invention. The method comprises generating a functional representation of the structural elements of the structures of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to high-voltage LDMOS devices and methods of manufacture. More specifically, the present invention is directed to high voltage CMOS technology featuring optimized HS (high speed) and LS (low speed) LDMOS devices for greater efficiencies in power switching topologies and enhanced reliability.

In embodiments, the LDMOS devices of the present invention are non-planar devices (use shallow trench isolation structures), but with superior off-state and on-state breakdown characteristics. Advantageously, the present invention optimizes (improves) on-state (Ron) and switching (Qg) which, in turn, improves net power dissipation while improving off-state and on-state breakdown voltage. That is, the present invention improves on state and off state breakdown voltages and device reliability, while simultaneously improving Idsat and Ron and reducing Qg, total. In particular embodiments, a halo design which is self-aligned to a p-well will lower the Ron, increase the drive current and the linearity of the output characteristics. Also, the processes of the present invention are compatible with existing processes, thus minimizing any additional fabrication costs.

In more specific embodiments, the present invention utilizes a thick oxide layer under a patterned gate region to protect the underlying semiconductor material during subsequent processes, e.g., etching. The present invention also provides a patterned spacing at a minimum ground rule design, so that spacer sidewalls can fill in a gap between the patterned gate region to further protect the underlying semiconductor material, thereby ensuring device reliability. In further embodiments, the present invention utilizes self-align halo implants to the p-well in order to lower the Ron, and improve the output curves (e.g., becoming more linear). The present invention also is layout driven without requiring additional masks.

In further specific embodiments, field plates, e.g., split gate region, can be connected to a source potential, as well as overlap an accumulation region thereby lowering Ron without degrading breakdown voltage and improving the linearity of the output characteristics. Moreover, the fermi-potential of the field plate can be varied for improved performance, e.g., placed over thin or thick oxide regions, with a floating region. In embodiments, a field plate is a depleting gate connected to the source terminal and another field plate is an accumulating gate, left floating and is introduced between the main gate (control gate) and depleting gate. These patterned field plates of varying fermi-potentials separated from the gate poly optimize Ron*Qg product.

FIGS. 1-10 show structures and respective processing steps in accordance with aspects of the present invention. It should be understood by those of skill in the art that the process of manufacturing the high-voltage LDMOS devices of the present invention can be manufactured in a number of ways using a number of different tools. In general, though, the methodologies and tools are adopted from integrated circuit (IC) technology to form the structures with certain dimensions. For example, the structures of the present invention, e.g., gate structures, patterned arrays, field plates, etc., are built on wafers and are realized in films of materials patterned by photolithographic processes. In particular, the fabrication of the structures uses three basic building blocks: (i) deposition of films of material on a substrate, (ii) applying a patterned mask on top of the films by photolithographic imaging, and (iii) etching the films selectively to the mask.

Figure 1:
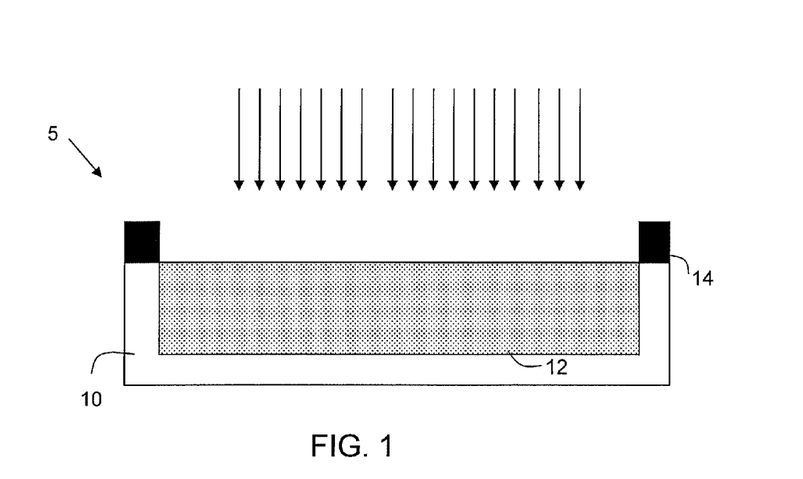
FIGS. 1-6 show structures and respective processing steps in accordance with an aspect of the present invention.

More specifically, as shown in FIG. 1, a starting structure 5 includes a substrate 10. In embodiments, the substrate 10 can be any layer of a device and more preferably an active semiconductor layer. As should be understood by those of skill in the art, the substrate 10 can be implemented in either an SOI wafer or BULK implementation, as examples. The constituent materials of the SOI wafer or BULK implementation may be selected based on the desired end use application of the semiconductor device. For example, the active semiconductor layer can be comprised of various semiconductor materials, such as, for example, Si, SiGe, SiC, SiGeC, etc. The SOI wafer may be fabricated by conventional processes including, but not limited to, oxygen implantation (e.g., SIMOX), wafer bonding, etc.

Still referring to FIG. 1, a deep well 12 is formed in the substrate 10 using conventional implantation processes. In embodiments, the deep well 12 is a deep N-well formed by implanting phosphorous into the substrate 10. In embodiments, the deep well 12 can be formed by other N-type dopants such as, for example, arsenic or antimony. In embodiments, the deep well 12 can extend to within the substrate 10 to any designed depth. In embodiments, the deep well 12 is defined by a resist pattern 14, which is formed by a deposition and development process known to those of skill in the art such that no further explanation is required herein for an understanding of the invention.

Figure 2:
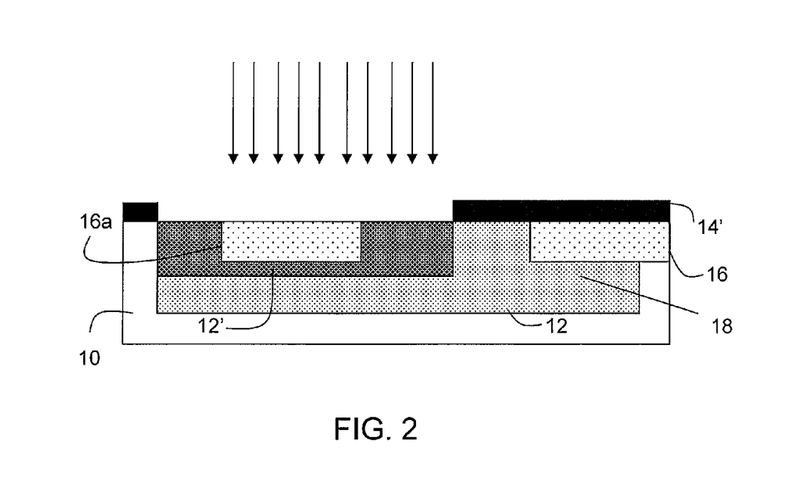

FIG. 2 shows additional processes in accordance with aspects of the present invention. Specifically, shallow trench isolation (STI) structures 16 are formed in the substrate 10, extending to within portions of the deep well 12. In embodiments, the STI structures 16 are formed using conventional lithography, etching and deposition processes. For example, a resist is formed on the substrate 10 and exposed to energy (light) to form openings. The substrate 10 then undergoes an etching process, e.g., reactive ion etching (RIE), to form trenches. An oxide or other insulator material is deposited in the trench, using conventional deposition processes such as, for example, chemical vapor deposition.

A drift region 12' is then formed in the substrate 10 and, more particularly, within the deep well 12. In embodiments, the drift region 12' is formed by a ion implant process by implanting an N-type dopant, e.g., phosphorous. The drift region 12' is defined by a resist pattern 14', which is formed by a deposition and development process known to those of skill in the art such that no further explanation is required herein for an understanding of the invention. In embodiments, the drift region 12' is aligned within one of the STI structures 16a; that is, the STI structure 16a is within the drift region 12'.

Figure 3:
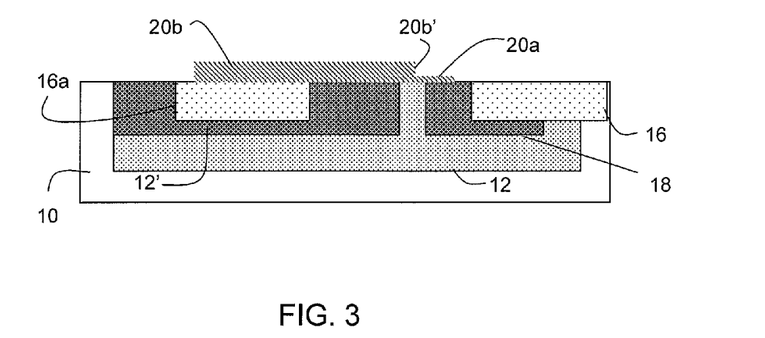

In FIG. 3, a P-well 18 is formed in the substrate 10. In embodiments, the P-well 18 is a P-doped implant region, formed by implanting boron into the substrate 10; although other P-type dopants are also contemplated by the present invention, e.g., Indium. In embodiments, the P-well 18 is defined by a resist pattern, which is formed by a deposition and development process known to those of skill in the art such that no further explanation is required herein for an understanding of the invention. The P-well 18 is preferably formed within a region of another of the STI regions 16.

Still referring to FIG. 3, a thin oxide layer 20a is formed over the substrate 10 and more specifically, extending over the drift region 12' and P-well 18. In embodiments, the thin oxide layer 20a is formed over a respective STI region 16 within the drift region. The thin oxide layer 20a can be $SiO_2$, $HfO_2$ or other high-k dielectric material. In embodiments, the thin oxide layer 20a can be formed using conventional deposition and patterning processes, as should be understood by those of skill in the art, e.g., CVD or plasma enhanced CVD (PECVD) process, followed by a RIE process. The thin oxide layer 20a can have a thickness of about 35 Å to 100 Å.

A thick oxide layer 20b is then formed over the thin oxide layer 20a, over the drift region 12' and extending onto the substrate 10 adjacent to the P-well region 18. The thick oxide layer 20b can be $SiO_2$, $HfO_2$ or other high-k dielectric material. In embodiments, the thick oxide layer 20b can be formed using conventional deposition and patterning processes, as should be understood by those of skill in the art, e.g., CVD or PECVD process followed by a RIE process. The thick oxide layer 20b can have a thickness of about 500 Å. Advantageously, the thick gate oxide 20b will help reduce the fields at the edge of a poly gate and field plate and also help protect the exposed silicon surface to improve reliability, e.g., from hole trapping to electron trapping.

In embodiments, the thick oxide layer 20b can be formed prior to the thin oxide layer 20a. For example, the thick oxide layer 20a can be deposited and patterned, using conventional deposition and etching processes as described herein. After deposition and patterning of the thicker oxide layer 20b, the thin oxide layer 20a can be deposited and patterned in a similar manner to the thicker oxide layer 20b. In this and other embodiments, the thick oxide layer 20b can be combined with the thin oxide layer 20a in order to increase its thickness. In any of the embodiments, the transition between the thick oxide layer 20b and the thin oxide layer 20a will form a stepped patterned 20b'.

Figure 4:
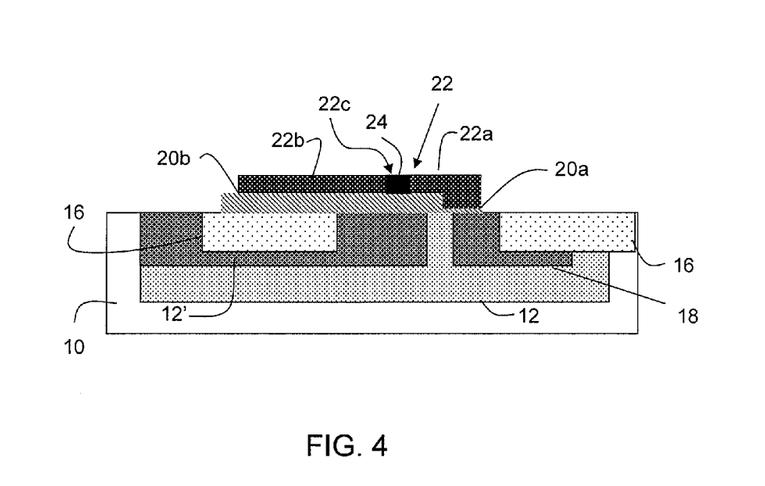

Referring to FIG. 4, a poly layer (field plate) 22 is deposited on the oxide layers 20a, 20b. In embodiments, the poly layer 22 can be deposited using any conventional deposition methods as described herein, and can be deposited to any depth depending on the technology node and design criteria. In embodiments, the poly layer 22 is patterned to form a gate structure (e.g., control gate structure) 22a and a poly region (e.g., split gate region) 22b over the deep well 12. As should be understood by those of skill in the art, the control gate structure 22a and split gate region 22b can also be referred to as field plates.

The control gate structure 22a will span between the thin oxide layer 20a, over the P-well region 18, and to the thick oxide layer 20b, over the deep well 12. In embodiments, the split gate region 22b and the control gate structure 22a are separated by spacing or gaps 22c, which can be completely or partially filled with a sidewall spacer 24. In specific embodiments, the space 22c can have dimensions of a minimum feature. It should be appreciated, though, that the space 22c can be other dimensions, depending on design criteria of the device. For example, the spacing 22c can be determined by the technology node of the device and, as such, the dimensions of the spacing 22c can be technology dependent, e.g., smaller or larger.

In embodiments, sidewall spacers 24 can completely or partially fill the space 22c. In embodiments, for example, the sidewall spacers 24 can be nitride or oxide, and can be formed by conventional deposition processes to partially or completely cover any exposed underlying oxide layer 20b (and substrate 10). By way of example, to completely cover any exposed surfaces between the control gate structure 22a and split gate region 22b, the sidewall spacers 24 are each about half the distance of the spacing 22c. In this way, the sidewall spacers 24 can protect the underlying substrate 10 and oxide layer 20b during subsequent processes, e.g., etching. In an alternate embodiment, the sidewall spacers 24 partially cover any exposed underlying oxide layer 20b.

Figure 5:
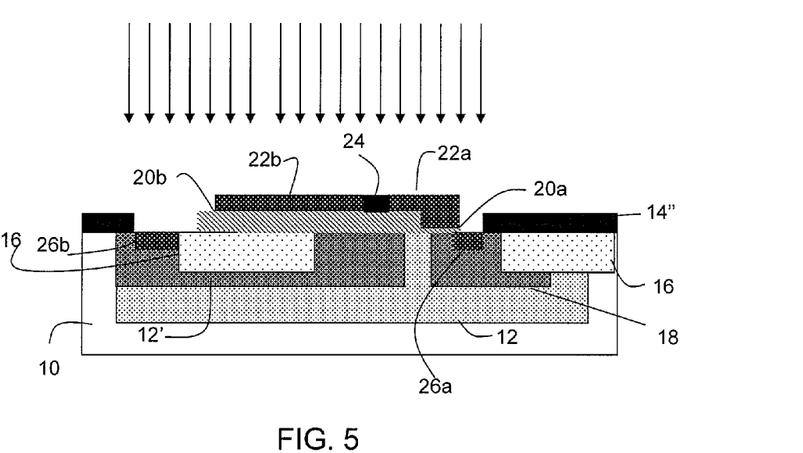

In FIG. 5, the structure undergoes an implantation process to form a source region 26a and a drain region 26b, as well as doping of the control gate structure 22a and the split gate region 22b. In embodiments, the implantation process is an N-type implanting process, e.g., phosphorous, arsenic or antimony. The implantation process is similar to that described herein, in that a resist 14" is formed to define the areas of implantation, e.g., source region 26a, drain region 26b, the control gate structure 22a and the split gate region 22b.

Figure 6:
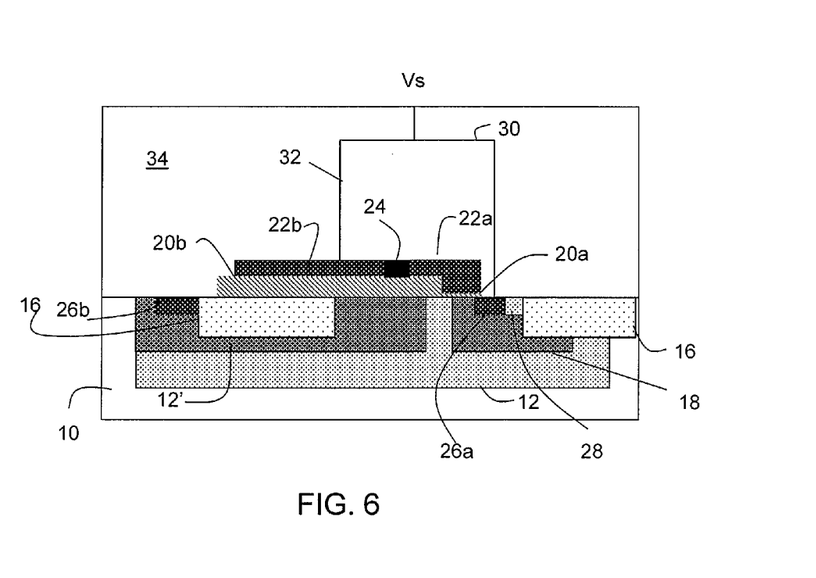

In FIG. 6, a P+ implant region 28 (body portion) is formed in the P-well 18, using conventional implantation processes. In embodiments, the P+ implant is boron or indium, for example. The P+ implant region 28 can be formed using conventional processes, as already described herein which includes the use of a blocking resist. After removal of the blocking resist, the structure undergoes a conventional silicide process on the source region 26a, drain region 26b, control gate structure 22a and split gate region 22b, in order to lower the contact resitivity of such regions 26a, 26b, 22a and 22b.

FIG. 6 further shows back end of the line processes in accordance with aspects of the present invention. More specifically, FIG. 6 shows the formation of a metal wiring 30 in direct structural and electrical contact with the split gate region 22b. In embodiments, the metal wiring 30 is formed to be in contact with the source region 26a and the poly region 22c, thereby grounding the split gate region 22b (e.g., non-floating region). In this way, the split gate region 22b can be a depleting gate connected to the source terminal 26a.

In forming the metal wiring 30, in embodiments, an interlevel dielectric layer 34 is deposited over the exposed portion of the structure. The deposition process can be, for example, CVD; although, other deposition processes are contemplated by the present invention. Vias are formed in the interlevel dielectric layer 34 using conventional lithography and etching processes. In embodiments, the vias are aligned and expose the underlying split gate 22b and the source region 26a. A metal, e.g., tungsten, copper or aluminum, is deposited in the vias to form the metal via 32. The metal can be deposited in the via using conventional deposition methods including, for example, sputtering techniques, electroplating, atomic layer deposition (ALD), or other conventional deposition methods. Any residual metal can be removed using a conventional polishing process, e.g., chemical mechanical polishing (CMP). The interlevel dielectric layer 34 can also undergo a planarization process, during this polishing process.

The metal wiring 30 is then formed by an additive or subtractive process in electrical contact with the metal vias 32. For example, in a subtractive process, a metal, e.g., tungsten, copper or aluminum, is deposited on the interlevel dielectric layer 34 using conventional deposition methods including, for example, CVD. A resist is formed over the metal and is patterned by exposing it to energy (light). The metal is then patterned using a conventional etching process. The resist is removed using an oxygen ashing process, followed by deposition of additional interlevel dielectric material, e.g., oxide.

Figure 7:
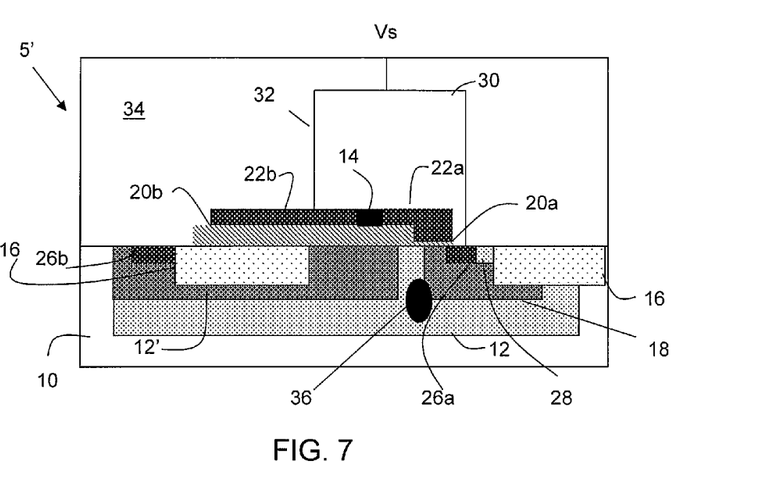
FIG. 7 shows a structure and respective processing steps in accordance with another aspect of the present invention.

FIG. 7 shows a structure and respective processing steps in accordance with another aspect of the present invention. More particular, the structure 5' includes a halo implant region 36 adjacent to the p-well 18. In embodiments, the halo implant region 36 is an N-type implant, e.g., phosphorous. The halo implant region 36 is formed by a steep angle ion implant process, which is self-aligned to the p-well 18. The halo implant region 36 can be implanted after the p-well implant, using resist patterns as described herein. In embodiments, the halo implant region 36 improves Idsat; that is, the halo implant region 36 will help reduce JFET punch-through effect and also increase reliability by forcing the current to go through the halo implant further away from the STI corner.

Figure 8:
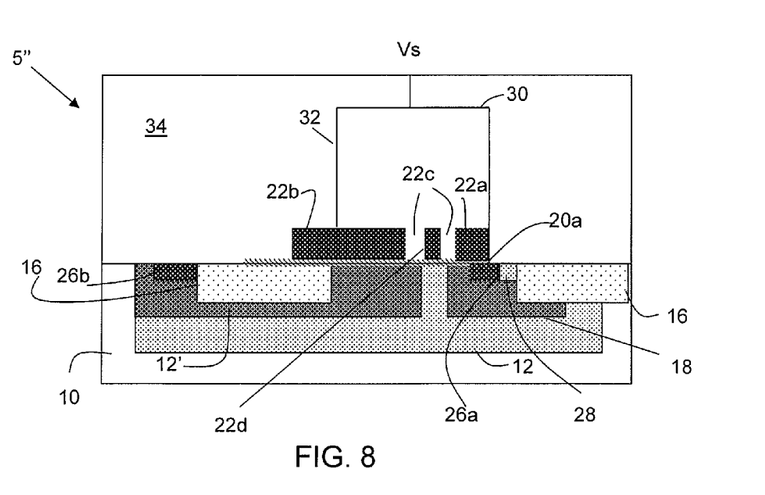
FIG. 8 shows a structure and respective processing steps in accordance with another aspect of the present invention.

FIG. 8 shows a structure and respective processing steps in accordance with another aspect of the present invention. More particular, the structure 5" includes a floating poly island 22d, on a thin oxide layer 20a. In this embodiments, the control gate structure 22a and the split gate region 22b are also formed on the thin oxide layer 20a; that is, this embodiment eliminates the need for a thick oxide layer. In this embodiment, the floating poly island (also referred to as a floating field plate) 22d is an accumulating gate, left floating and is introduced between the control gate structure 22a and the split gate region (e.g., depleting gate) 22b. In embodiments, any combination of the accumulating gate 22d and depleting gate 22b can be doped with variable fermi potentials, e.g., n+, p– or p+, independent of the control gate structure 22a and by using the resist patterning and ion implanting processes discussed herein. Advantageously, the accumulating gate 22d between the control gate structure 22a and the split gate region 22b will assume a potential between the control gate structure 22a and source potentials. This, in turn, will help reduce Ron by creating an accumulation channel. Moreover, the accumulating gate 22d will take away some more area from the gate to drain overlap region thus reducing gate to drain capacitance.

In embodiments, the accumulating gate 22d is formed during the patterning process of the control gate structure 22a and the split gate region 22b; that is, after depositing the poly layer 22 on the thin oxide layer 20a, the poly layer will undergo a conventional lithography and etching process to form the accumulating gate 22d, control gate structure 22a and the split gate region 22b. In embodiments, a spacing 22c is provided between the structures 22a, 22b and 22d. This spacing, as with other aspects of the present invention, can be a minimum spacing; although, other dimensions are also contemplated by the present invention. In further embodiments, the accumulating gate 22d can be positioned between the drift region 12' and the p-well 18 (and control gate structure 22a and the split gate region 22b); although other locations are also contemplated by the present invention.

Figure 9:
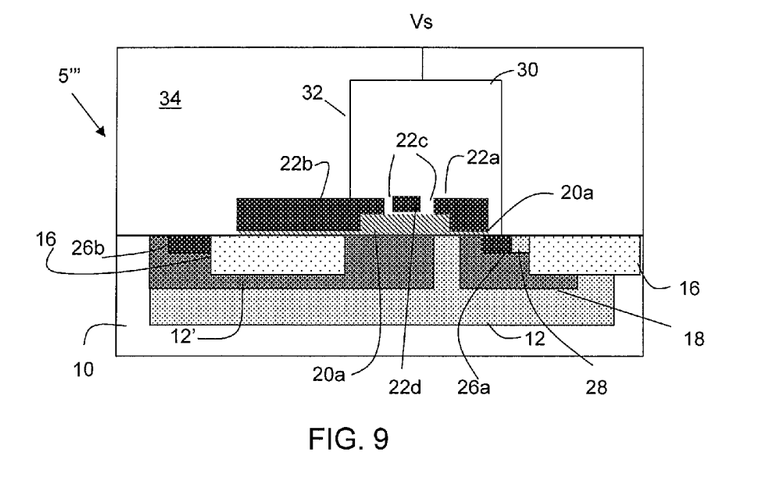
FIG. 9 shows a structure and respective processing steps in accordance with another aspect of the present invention.

FIG. 9 shows a structure and respective processing steps in accordance with another aspect of the present invention. More particular, the structure 5''' includes a floating poly island 22d, on a thick oxide layer 20b. In embodiments, the floating poly island 22d (accumulating gate) can be formed entirely on the thick oxide portion 20b. In this embodiment, the control gate structure 22a and split gate region 22b are also formed partially on the thick oxide layer 20b. The thick oxide layer 20b ensures surface protection of the underlying materials during subsequent processing steps. Again, advantageously, the accumulating gate 22d between the control gate structure 22a and the split gate region 22b will assume a potential between the control gate structure 22a and source potentials. This, in turn, will help reduce Ron by creating an accumulation channel. Moreover, the floating poly island 22d will take away some more area from the gate to drain overlap region thus reducing gate to drain capacitance.

In embodiments, the accumulating gate 22d is formed during the patterning process of the control gate structure 22a and the split gate region 22b; that is, after depositing the poly layer 22 on the thin oxide layer 20a and the thick oxide layer 20b (which can be formed in the manner described above), the poly layer will undergo a conventional lithography and etching process to form the accumulating gate 22d, control gate structure 22a and the split gate region 22b. In embodiments, a spacing 22c is provided between the structures 22a, 22b and 22d. This spacing, as with other aspects of the present invention, can be a minimum spacing; although, other dimensions are also contemplated by the present invention.

Figure 10:
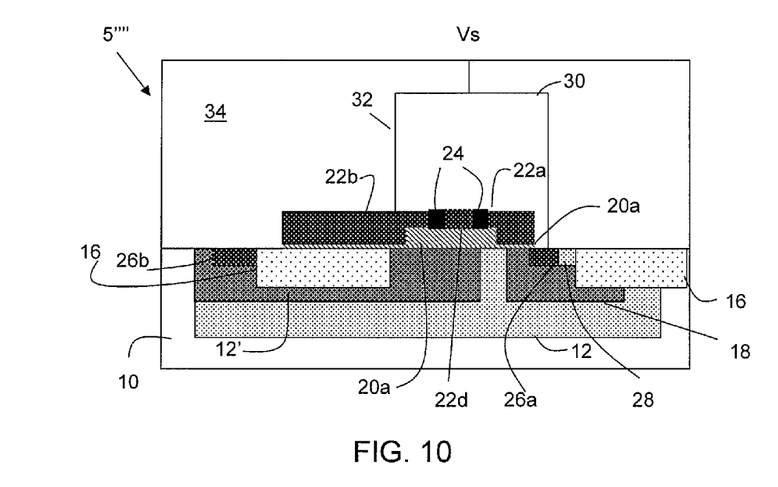
FIG. 10 shows a structure and respective processing steps in accordance with another aspect of the present invention.

In FIG. 10, the spacing between the accumulating gate 22d, the control gate structure 22a and the split gate region 22b can be filled with a sidewall spacer 24. As in previously described embodiments, the sidewall spacer 24 can be an oxide or nitride material, and preferably completely fills the spacing between the structures 22a, 22b and 22d. In embodiments, the sidewall spacer 24 will protect underlying material from subsequent processes.

It should also be understood that any of the structures of the present invention can also be combined together, to form similar but different structures. For example, the poly structures 22a, 22b and 22d can be formed on different combinations of thin and thick oxide layers.

Flow Diagram

Figure 11:
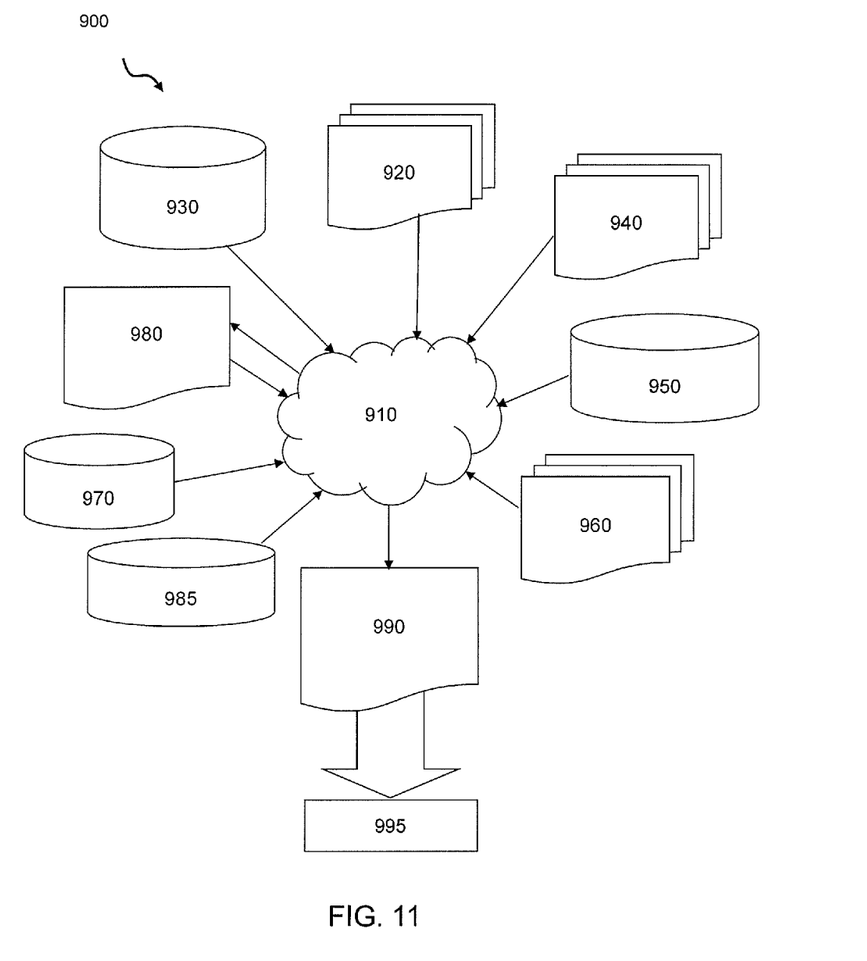
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture of the structures described herein. Design flow 900 includes processes, machines and/or mechanisms for processing design structures or devices to generate logically or otherwise functionally equivalent representations of the design structures and/or devices described above. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Thus, the design structures can be provided in a computer program product comprising a computer readable storage medium having stored/encoded thereon. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention. In one embodiment, design structure 990 may comprise a compiled, executable HDL simulation model that functionally simulates the devices.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming an insulator layer of varying depth over a drift region and a body of a substrate; and
   forming a control gate and a split gate region by patterning a layer of material on the insulator layer, wherein the split gate region is formed on a first portion of the insulator layer and the control gate is formed on a second portion of the insulator layer, which is thinner than the first portion, and the split gate region is formed entirely on the first portion and the control gate is partially formed on the first portion,
   wherein the patterning forms a space between the control gate and the split gate region.

2. The method of claim 1, wherein the insulator layer is an oxide layer formed in two separate deposition and patterning steps.

3. The method of claim 1, wherein the split gate region is a depletion gate, formed in electrical contact with a source region.

4. A method, comprising:
   forming an insulator layer of varying depth over a drift region and a body of a substrate;
   forming a control gate and a split gate region by patterning a layer of material on the insulator layer, wherein the split gate region is formed on a first portion of the insulator layer and the control gate is formed on a second portion of the insulator layer, which is thinner than the first portion, and the split gate region is a depletion gate, formed in electrical contact with a source region; and
   implanting a halo region self-aligned with the body of the substrate.

5. The method of claim 1, further comprising forming a spacer on a sidewall of the control gate and the split gate region, filling the space.

6. A method, comprising:
   forming an insulator layer of varying depth over a drift region and a body of a substrate; and
   forming a control gate and a split gate region by patterning a layer of material on the insulator layer, wherein the split gate region is formed on a first portion of the insulator layer and the control gate is formed on a second portion of the insulator layer, which is thinner than the first portion, and forming a spacer on a sidewall of the control gate and the split gate region, filling the space, wherein the patterning forms a space between the control gate and the split gate region, and the spacer completely fills the space and protects the underlying substrate during subsequent processes.

7. The method of claim 1, further comprising patterning the layer of material to form a floating region, between the control gate and the split gate region.

8. A method, comprising:

forming an insulator layer of varying depth over a drift region and a body of a substrate;

forming a control gate and a split gate region by patterning a layer of material on the insulator layer, wherein the split gate region is formed on a first portion of the insulator layer and the control gate is formed on a second portion of the insulator layer, which is thinner than the first portion, and the patterning forms a space between the control gate and the split gate region; and patterning the layer of material to form a floating region, between the control gate and the split gate region, wherein the floating region is formed entirely on the first portion and acts as an accumulating gate.

9. A method, comprising:

forming an insulator layer of varying depth over a drift region and a body of a substrate;

forming a control gate and a split gate region by patterning a layer of material on the insulator layer, wherein the split gate region is formed on a first portion of the insulator layer and the control gate is formed on a second portion of the insulator layer, which is thinner than the first portion, and the patterning forms a space between the control gate and the split gate region;

patterning the layer of material to form a floating region, between the control gate and the split gate region, and forming spacers on sidewalls of the floating region, the control gate and the split gate region.

10. A method, comprising:

forming an insulator layer of varying depth over a drift region and a body of a substrate;

forming a control gate and a split gate region by patterning a layer of material on the insulator layer, wherein the split gate region is formed on a first portion of the insulator layer and the control gate is formed on a second portion of the insulator layer, which is thinner than the first portion, and the patterning forms a space between the control gate and the split gate region;

patterning the layer of material to form a floating region, between the control gate and the split gate region, and doping the floating region and the split gate region with same or different dopants.

11. The method of claim 1, wherein the layer of material is a poly layer.

12. A method, comprising:

forming an insulator layer over a well implant region and a drift region formed within confines of a deep well implant region;

forming a plate on the insulator layer;

patterning the plate to form field plates comprising a split gate region, a control gate and a floating region; and forming a metal wiring in electrical contact with the split gate region and a source region implanted into the well implant region.

13. The method of claim 12, wherein the insulator layer is oxide layer.

14. The method of claim 12, wherein the plate is a poly material.

15. The method of claim 12, further comprising implanting the split gate region and the floating region with a same dopant, independent of the control gate.

16. The method of claim 12, further comprising implanting the split gate region and the floating region with a different dopant, independent of the control gate.

17. The method of claim 12, further comprising forming spacers on sidewalls of the floating region, the control gate and the split gate region to protect an underlying substrate during subsequent processes.

18. A device, comprising:

an insulator layer of varying depth over a drift region and a body of a substrate; and a control gate and a split gate region on the insulator layer, wherein the split gate region is on a first portion of the insulator layer and the control gate is on a second portion of the insulator layer, which is thinner than the first portion, and a space is between the control gate and the split gate region, and the floating region and the split gate region have same or different dopants.

19. The device of claim 18, wherein the split gate region is formed entirely on the first portion and the control gate is partially formed on the first portion.

* * * * *